(12) United States Patent
Arima et al.

(10) Patent No.: US 12,520,510 B2
(45) Date of Patent: Jan. 6, 2026

(54) SCHOTTKY BARRIER DIODE

(71) Applicant: TDK Corporation, Tokyo (JP)

(72) Inventors: Jun Arima, Tokyo (JP); Minoru Fujita, Tokyo (JP); Katsumi Kawasaki, Tokyo (JP); Jun Hirabayashi, Tokyo (JP)

(73) Assignee: TDK CORPORATION, Tokyo (JP)

( * ) Notice: Subject to any disclaimer, the term of this patent is extended or adjusted under 35 U.S.C. 154(b) by 375 days.

(21) Appl. No.: 18/260,520

(22) PCT Filed: Jan. 28, 2022

(86) PCT No.: PCT/JP2022/003329
§ 371 (c)(1),
(2) Date: Jul. 6, 2023

(87) PCT Pub. No.: WO2022/181203
PCT Pub. Date: Sep. 1, 2022

(65) Prior Publication Data
US 2024/0055536 A1 Feb. 15, 2024

(30) Foreign Application Priority Data

Feb. 25, 2021 (JP) ................................. 2021-028799

(51) Int. Cl.
*H10D 62/80* (2025.01)
*H10D 8/60* (2025.01)

(52) U.S. Cl.
CPC ............ *H10D 8/605* (2025.01); *H10D 62/80* (2025.01)

(58) Field of Classification Search
CPC .. H10D 8/60–605; H10D 8/051; H10D 8/045; H10D 8/50; H10D 8/411;
(Continued)

(56) References Cited

U.S. PATENT DOCUMENTS

2001/0000033 A1  3/2001  Baliga
2015/0228809 A1  8/2015  Sugiura et al.
(Continued)

FOREIGN PATENT DOCUMENTS

EP  3 703 137 A1  9/2020
EP  3 780 119 A1  2/2021
(Continued)

OTHER PUBLICATIONS

International Search Report issued in corresponding International Patent Application No. PCT/JP2022/003329, dated Mar. 29, 2022, with English translation.

(Continued)

*Primary Examiner* — Moin M Rahman
(74) *Attorney, Agent, or Firm* — Rimon P.C

(57) ABSTRACT

To prevent dielectric breakdown of a Schottky barrier diode using gallium oxide. A Schottky barrier diode has a drift layer provided on a semiconductor substrate, an anode electrode, and a cathode electrode. A part of the anode electrode is embedded in an outer peripheral trench and a center trench through an insulating film. The insulating film is formed such that the thickness thereof in the depth direction of the outer peripheral trench becomes larger toward the outside, whereby an outer peripheral wall S1 of the anode electrode embedded in the outer peripheral trench is curved so as to approach vertical toward the outside. This results in relaxation of an electric field which occurs at the outer peripheral bottom portion of the outer peripheral trench upon application of a backward voltage.

7 Claims, 17 Drawing Sheets

(58) Field of Classification Search
CPC .. H10D 8/422; H10D 8/00–825; H10D 8/041; H10D 62/8325; H10D 62/8503; H10D 64/01; H10D 64/64; H10D 62/126; H10D 62/60; H10D 62/106; H10D 62/102; H10D 62/124; H10D 62/80; H10D 64/23; H10D 62/115; H10D 88/00; H10D 88/101; H10D 84/983–988; H10D 88/01; H10B 20/40–65; H10B 53/20; H10B 41/20–27; H10B 43/20–27; H10B 51/20; H10B 63/84–845
See application file for complete search history.

(56) References Cited

U.S. PATENT DOCUMENTS

| | | |
|---|---|---|
| 2017/0301792 A1 | 10/2017 | Konrath et al. |
| 2019/0148563 A1 | 5/2019 | Sasaki et al. |
| 2021/0036166 A1* | 2/2021 | Yu .............................. H10D 8/50 |
| 2021/0167225 A1 | 6/2021 | Arima et al. |
| 2021/0234009 A1 | 7/2021 | Yuda et al. |
| 2021/0265511 A1 | 8/2021 | Kabutoya |

FOREIGN PATENT DOCUMENTS

| | | |
|---|---|---|
| JP | 2017-199869 A | 11/2017 |
| JP | 2018-200919 A | 12/2018 |
| JP | 2019-079984 A | 5/2019 |
| JP | 2020-004906 A | 1/2020 |
| WO | 2019/082580 A1 | 5/2019 |
| WO | 2020/004437 A1 | 1/2020 |
| WO | 2020/039971 A1 | 2/2020 |

OTHER PUBLICATIONS

Extended European Search report issued in the corresponding European Application No. 22759244.1, dated Dec. 12, 2024.

* cited by examiner

| D2(μm) | D1(μm) | t2(μm) | b(μm) | t2/D1 | Maximum Electric Field Strength Applied to Drift Layer 30 (MV/cm) | Maximum Electric Field Strength Applied to Insulating Film 64 (MV/cm) |
|---|---|---|---|---|---|---|
| 3.0 | 4.0 | 0.36 | 3.64 | 0.09 | 7.0 | 10.8 |
| 3.0 | 4.0 | 0.40 | 3.60 | 0.10 | 6.8 | 9.8 |
| 3.0 | 4.0 | 0.60 | 3.40 | 0.15 | 5.8 | 9.4 |
| 3.0 | 4.0 | 2.10 | 1.90 | 0.53 | 7.4 | 4.8 |
| 3.0 | 4.0 | 2.40 | 1.60 | 0.60 | 7.7 | 4.8 |

| D2(μm) | D1(μm) | t2(μm) | b(μm) | t2/D1 | Maximum Electric Field Strength Applied to Drift Layer 30 (MV/cm) | Maximum Electric Field Strength Applied to Insulating Film 64 (MV/cm) |
|---|---|---|---|---|---|---|
| 3.0 | 5.0 | 0.45 | 4.55 | 0.09 | 6.8 | 10.6 |
| 3.0 | 5.0 | 0.50 | 4.50 | 0.10 | 6.4 | 9.7 |
| 3.0 | 5.0 | 0.80 | 4.20 | 0.16 | 6.0 | 9.0 |
| 3.0 | 5.0 | 2.70 | 2.30 | 0.54 | 6.0 | 4.8 |
| 3.0 | 5.0 | 3.00 | 2.00 | 0.60 | 6.4 | 4.6 |

| D2(μm) | D1(μm) | t2(μm) | b(μm) | t2/D1 | Maximum Electric Field Strength Applied to Drift Layer 30 (MV/cm) | Maximum Electric Field Strength Applied to Insulating Film 64 (MV/cm) |
|---|---|---|---|---|---|---|
| 3.0 | 6.0 | 0.43 | 4.57 | 0.09 | 7.4 | 10.6 |
| 3.0 | 6.0 | 0.48 | 4.52 | 0.10 | 6.8 | 9.9 |
| 3.0 | 6.0 | 0.60 | 4.40 | 0.12 | 6.7 | 9.3 |
| 3.0 | 6.0 | 2.70 | 2.30 | 0.54 | 3.8 | 5.9 |
| 3.0 | 6.0 | 3.00 | 2.00 | 0.60 | 4.2 | 4.9 |

FIG. 17

SCHOTTKY BARRIER DIODE

CROSS REFERENCE TO RELATED APPLICATIONS

This application is the U.S. National Phase under 35 U.S.C. § 371 of International Application No. PCT/JP2022/003329, filed on Jan. 28, 2022, which claims the benefit of Japanese Patent Application No. 2021-028799, filed on Feb. 25, 2021, the entire contents of each are hereby incorporated by reference.

TECHNICAL FIELD

The present invention relates to a Schottky barrier diode and, more particularly, to a Schottky barrier diode using gallium oxide.

BACKGROUND ART

A Schottky barrier diode is a rectifying element utilizing a Schottky barrier generated due to bonding between metal and a semiconductor and is lower in forward voltage and higher in switching speed than a normal diode having a PN junction. Thus, the Schottky barrier diode is sometimes utilized as a switching element for a power device.

When the Schottky barrier diode is utilized as a switching element for a power device, it is necessary to ensure a sufficient backward withstand voltage, so that, silicon carbide (SiC), gallium nitride (GaN), or gallium oxide ($Ga_2O_3$) having a larger band gap is sometimes used in place of silicon (Si). Among them, gallium oxide has a very large band gap (4.8 eV to 4.9 eV) and a large breakdown field of about 8 MV/cm, so that a Schottky barrier diode using gallium oxide is very promising as the switching element for a power device. An example of the Schottky barrier diode using gallium oxide is described in Patent Document 1.

In the Schottky barrier diode described in Patent Document 1, a plurality of trenches are formed in a gallium oxide layer, and a part of an anode electrode is embedded in the trenches through an insulating film. With this structure, when a backward voltage is applied, a mesa region positioned between adjacent trenches becomes a depletion layer, so that a channel region of a drift layer is pinched off. Thus, a leak current upon application of the backward voltage can be significantly reduced.

CITATION LIST

Patent Document

[Patent Document 1] JP 2017-199869A

DISCLOSURE OF THE INVENTION

Problem to be Solved by the Invention

However, in conventional Schottky barrier diodes having the trenches, an electric field concentrates on the outer peripheral bottom portion of an outermost peripheral trench upon application of a backward voltage, so that dielectric breakdown is likely to occur at this portion.

It is therefore an object of the present invention to prevent, in a Schottky barrier diode using gallium oxide, dielectric breakdown by relaxing an electric field occurring upon application of a backward voltage.

Means for Solving the Problem

A Schottky barrier diode according to the present invention includes a semiconductor substrate made of gallium oxide, a drift layer made of gallium oxide and provided on the semiconductor substrate, an anode electrode brought into Schottky contact with the drift layer, a cathode electrode brought into ohmic contact with the semiconductor substrate, and an insulating film covering the inner wall of a trench formed in the drift layer. The trench includes a ring-shaped outer peripheral trench and a center trench formed in an area surrounded by the outer peripheral trench. A part of the anode electrode is embedded in the outer and center trenches through the insulating film. The insulating film is formed such that the thickness thereof in the depth direction of the outer peripheral trench becomes larger toward the outside, whereby the outer peripheral wall of the anode electrode embedded in the outer peripheral trench is curved so as to approach vertical toward the outside.

According to the present invention, the outer peripheral wall of the anode electrode embedded in the outer peripheral trench is curved so as to approach vertical toward the outside, thereby relaxing an electric field which occurs at the outer peripheral bottom portion of the outer peripheral trench upon application of a backward voltage.

In the present invention, the inner peripheral wall of the anode electrode embedded in the outer peripheral trench is closer to vertical than the outer peripheral wall, thereby allowing a mesa region between the center and outer peripheral trenches to be pinched off reliably.

In the present invention, the outer peripheral trench is larger in width than the center trench. This can further relax an electric field occurring at the outer peripheral bottom portion of the outer peripheral trench.

In the present invention, the outer peripheral trench is larger in depth than the center trench. This can further relax an electric field occurring at the outer peripheral bottom portion of the outer peripheral trench.

In the present invention, the upper surface of the drift layer positioned outside the outer peripheral trench may be covered with the insulating film. Thus, the upper surface of the drift layer is protected by the insulating film.

In the present invention, a part of the insulating film that covers at least the inner wall of the outer peripheral trench may have a multilayer structure. This facilitates control of the film thickness and characteristics of the insulating film.

Advantageous Effects of the Invention

As described above, according to the present invention, an electric field occurring upon application of a backward voltage is relaxed, whereby it is possible to prevent dielectric breakdown of a Schottky barrier diode using gallium oxide.

BRIEF DESCRIPTION OF THE DRAWINGS

FIG. 17 is a table illustrating the simulation results of an Example 3.

MODE FOR CARRYING OUT THE INVENTION

Hereinafter, preferred embodiments of the present invention will be described in detail with reference to the accompanying drawings.

First Embodiment

Figure 1:
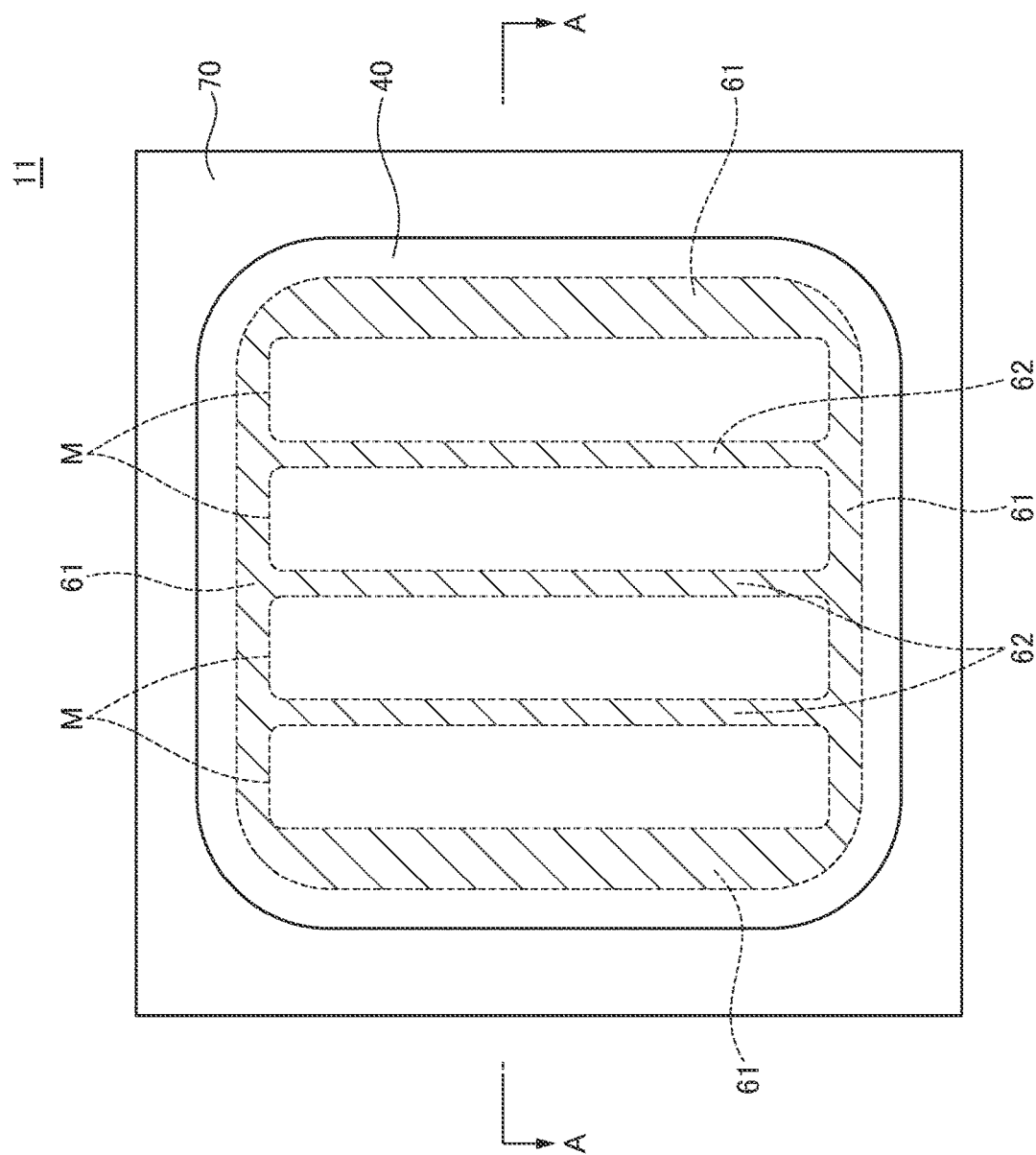
FIG. 1 is a schematic plan view illustrating the configuration of a Schottky barrier diode 11 according to a first embodiment of the present invention.
Figure 2:
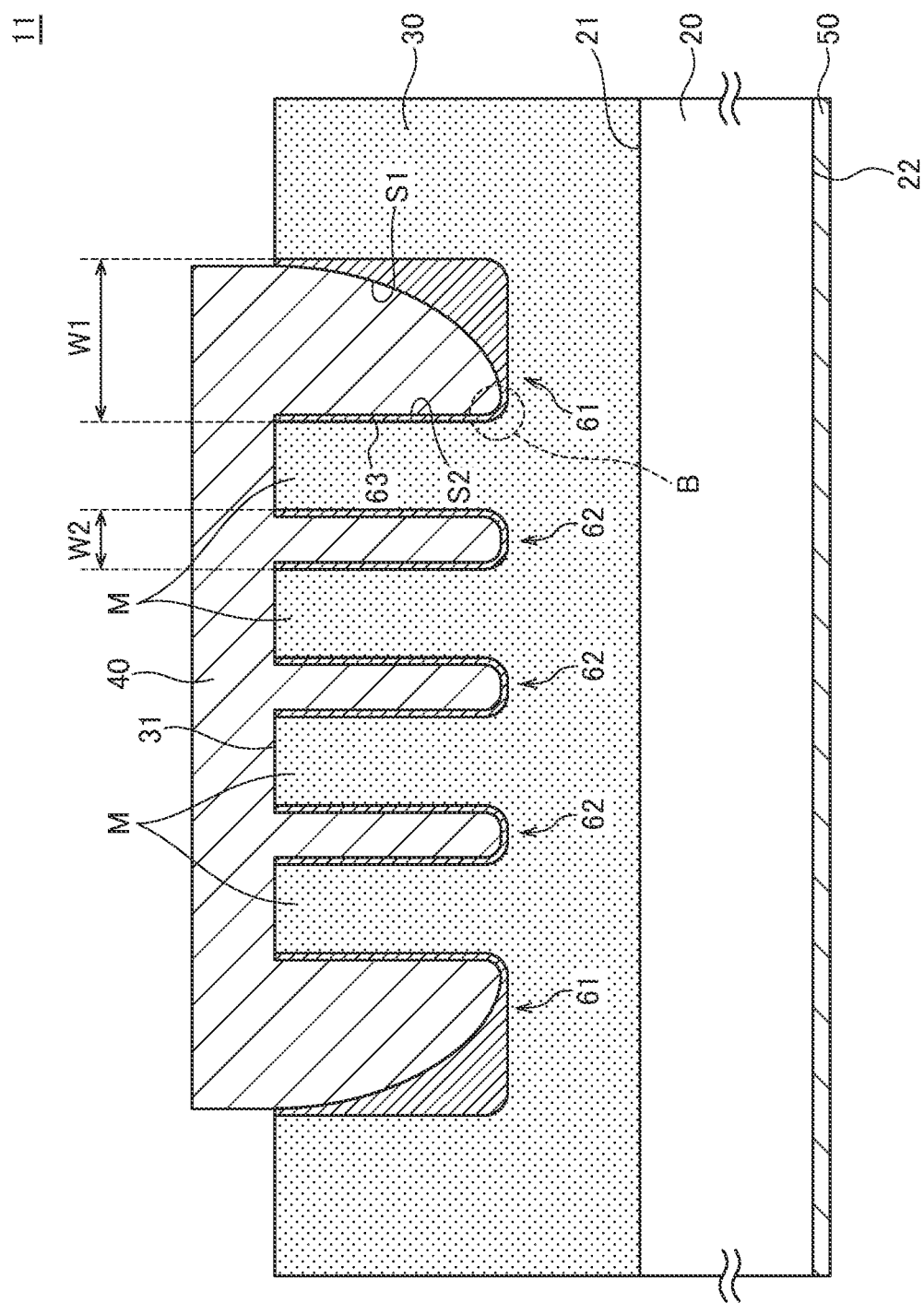
FIG. 2 is a schematic cross-sectional view taken along the line A-A in FIG. 1.

FIG. 1 is a schematic plan view illustrating the configuration of a Schottky barrier diode 11 according to a first embodiment of the present invention. FIG. 2 is a schematic cross-sectional view taken along the line A-A in FIG. 1.

As illustrated in FIGS. 1 and 2, the Schottky barrier diode 11 according to the present embodiment has a semiconductor substrate 20 and a drift layer 30, both of which are made of gallium oxide ($\beta$-$Ga_2O_3$). The semiconductor substrate 20 and drift layer 30 are each introduced with silicon (Si) or tin (Sn) as an n-type dopant. The concentration of the dopant is higher in the semiconductor substrate 20 than in the drift layer 30, whereby the semiconductor substrate 20 and the drift layer 30 function as an $n^+$ layer and an $n^-$ layer, respectively.

The semiconductor substrate 20 is obtained by cutting a bulk crystal formed using a melt-growing method, and the thickness thereof is about 250 μm. Although there is no particular restriction on the planar size of the semiconductor substrate 20, the planar size is generally selected in accordance with the amount of current flowing in the element and, when the maximum amount of forward current is about 20 A, the planar size may be set to about 2.4 mm×2.4 mm.

The semiconductor substrate 20 has an upper surface 21 positioned on the upper surface side in a mounted state and a back surface 22 facing away from the upper surface 21 and positioned on the lower surface side in a mounted state. A drift layer 30 is formed on the entire upper surface 21. The drift layer 30 is a thin film obtained by epitaxially growing gallium oxide on the upper surface 21 of the semiconductor substrate 20 using a reactive sputtering method, a PLD method, an MBE method, an MOCVD method, or an HVPE method. Although there is no particular restriction on the film thickness of the drift layer 30, the film thickness is generally selected in accordance with the backward withstand voltage of the element and, in order to ensure a withstand voltage of about 600 V, the film thickness may be set to, e.g., about 7 μm.

An anode electrode 40 brought into Schottky contact with the drift layer 30 is formed on an upper surface 31 of the drift layer 30. The anode electrode 40 is formed of metal such as platinum (Pt), palladium (Pd), gold (Au), nickel (Ni), molybdenum (Mo), or Copper (Cu). The anode electrode 40 may have a multilayer structure of different metal films, such as Pt/Au, Pt/Al, Pd/Au, Pd/Al, Pt/Ti/Au, or Pd/Ti/Au. On the other hand, a cathode electrode 50 brought into ohmic contact with the semiconductor substrate 20 is formed on the back surface 22 of the semiconductor substrate 20. The cathode electrode 50 is formed of metal such as titanium (Ti). The cathode electrode 50 may have a multilayer structure of different metal films, such as Ti/Au or Ti/Al.

In the present embodiment, a plurality of trenches 61 and 62 are formed in the drift layer 30. The trenches 61 and 62 are each formed at a position overlapping the anode electrode 40 in a plan view. The trench 61 is an outer peripheral trench formed into a ring shape, and the trenches 62 are center trenches formed in an area surrounded by the outer peripheral trench. The outer peripheral trench 61 and the center trenches need not completely be separated from each other, but may be connected to each other as illustrated in FIG. 1. In the present embodiment, the outer peripheral trench 61 and the center trenches 62 have the same depth.

The inner wall of each of the trenches 61 and 62 is covered with an insulating film 63 made of, e.g., $HfO_2$, and the inside thereof is filled with the same material as the anode electrode 40. In the present embodiment, since the plurality of trenches 61 and 62 are formed in the drift layer 30, the anode electrode 40 may be made of a material having a low work function such as molybdenum (Mo) or copper (Cu). Further, since the plurality of trenches 61 and 62 are formed in the drift layer 30, the dopant concentration of the drift layer 30 can be increased to about $4\times10^{16}$ $cm^{-3}$.

A part of the drift layer 30 that is sectioned by the trenches 61 and 62 constitutes a mesa region M. The mesa region M becomes a depletion layer when a backward voltage is applied between the anode electrode 40 and the cathode electrode 50, so that a channel region of the drift layer 30 is pinched off. Thus, a leak current upon application of the backward voltage can be significantly reduced.

In the present embodiment, assuming that the widths of the outer peripheral trench 61 and the center trench 62 along the line A-A are W1 and W2, respectively, W1>W2 is satisfied.

The width W1 of the of the outer peripheral trench 61 refers to a width in the radial direction, and the width W2 of the center trench 62 refers to a width in the mesa width direction.

Further, the insulating film 63 covering the inner wall of the outer peripheral trench 61 is formed such that the thickness thereof in the depth direction (i.e., vertical direction) becomes larger toward the outside in the radial direction. In other words, the thickness of the insulating film 63 in a direction (i.e., horizontal direction) perpendicular to the outer peripheral wall of the outer peripheral trench 61 becomes larger as the vertical position of the insulating film 63 becomes closer to the upper surface 21 of the semiconductor substrate 20. The thickness increases in a quadratic function manner, whereby an outer peripheral wall S1 of the anode electrode 40 embedded in the outer peripheral trench 61 is gently curved so as to approach vertical toward the outside. On the other hand, the thickness in the horizontal direction of the insulating film 63 formed on the inner peripheral wall of the outer peripheral trench 61 is substantially constant, whereby an inner peripheral wall S2 of the anode electrode 40 is closer to vertical than the outer peripheral wall S1 of the anode electrode 40. That is, although the inclination of the outer peripheral wall S1 of the anode electrode 40 with respect to the upper surface 31 of the drift layer 30 is small in the vicinity of the boundary with the inner peripheral wall S2, it gradually increases toward the outside and eventually becomes substantially vertical in the vicinity of the upper surface 31 of the drift layer 30. On the other hand, the inner peripheral wall S2 of the anode electrode 40 is substantially vertical although it is curved slightly in the vicinity of the boundary with the outer peripheral wall S1.

As describe above, in the present embodiment, the radial cross section of the anode electrode 40 embedded in the outer peripheral trench 61 is asymmetric. One of the reasons that the width W1 of the outer peripheral trench 61 is set larger than the width W2 of the center trench 62 is to ensure a radial space large enough to allow the outer peripheral wall S1 of the anode electrode 40 to be gently curved. For example, the insulating film 63 having such a shape can be formed by performing, using a plurality of masks, multi-step film formation or multi-step etching.

Figure 3:
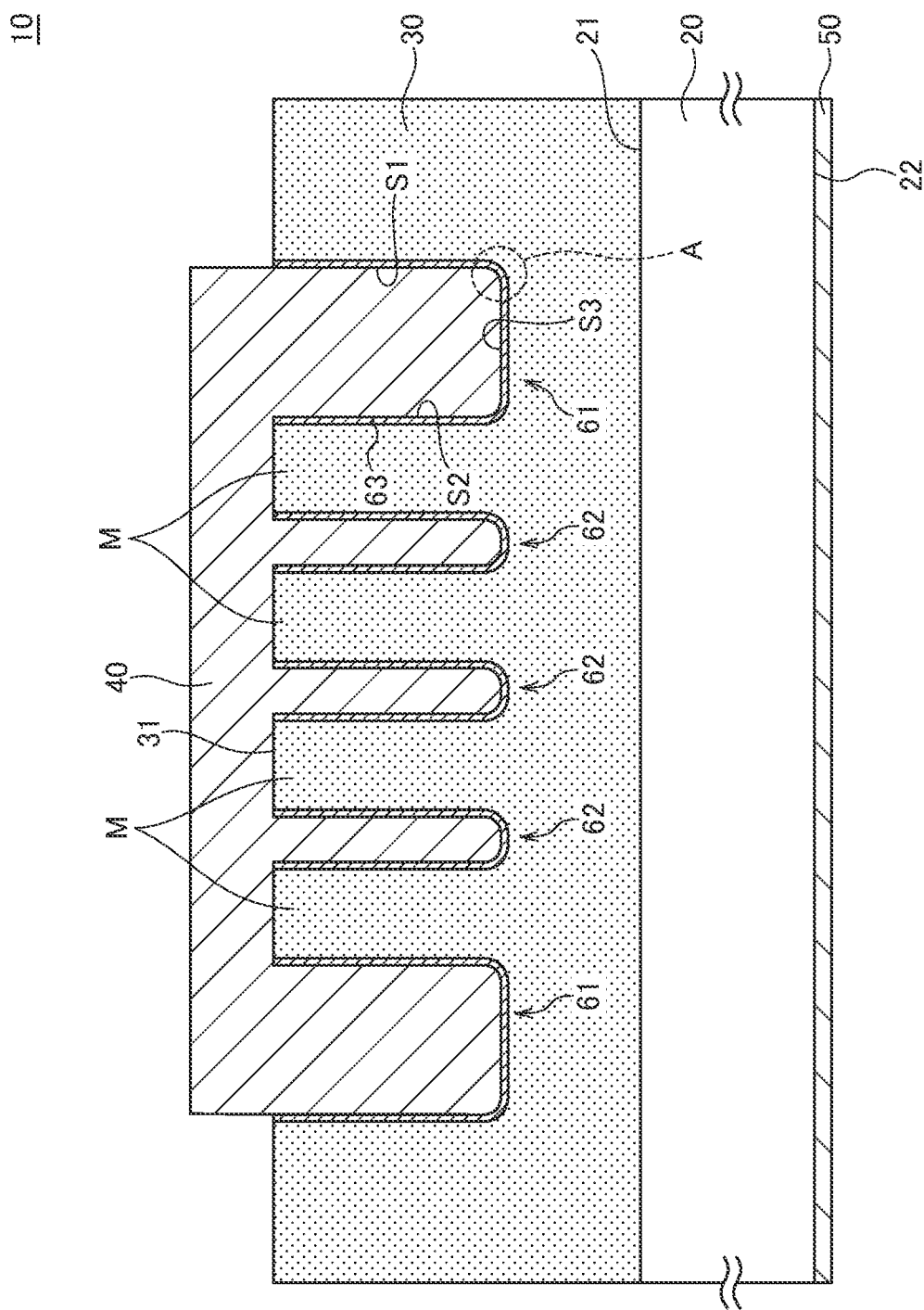
FIG. 3 is a schematic cross-sectional view illustrating the configuration of a Schottky barrier diode 10 according to a Comparative Example.

FIG. 3 is a schematic cross-sectional view illustrating the configuration of a Schottky barrier diode 10 according to a comparative example.

In the Schottky barrier diode 10 illustrated in FIG. 3, the thickness of the insulating film 63 in a direction perpendicular to the wall surface of the outer peripheral trench 61 is constant. Thus, the radial cross section of the anode electrode 40 embedded in the outer peripheral trench 61 is symmetric, and both the outer peripheral wall S1 and inner peripheral wall S2 are substantially vertical. In such a structure, the curvature radius of an outer peripheral bottom portion A positioned between the outer peripheral wall S1 of the anode electrode 40 and a bottom surface S3 thereof is small, so that an electric field concentrates on this portion, which may result in dielectric breakdown.

On the other hand, in the Schottky barrier diode 11 according to the present embodiment, the radial cross-section of the anode electrode 40 embedded in the outer peripheral trench 61 is asymmetric, and the outer peripheral wall S1 itself of the anode electrode 40 constitutes a gently curved surface having a large curvature radius, so that an electric field is widely distributed. In the present embodiment, although the curvature radius of an inner peripheral bottom portion B positioned at the boundary between the outer peripheral wall S1 and the inner peripheral wall S2 is comparatively small, the outer peripheral wall S1 itself having a large curvature radius distributes an electric field, substantially preventing concentration of an electric field at the inner peripheral bottom portion B. In addition, the inner peripheral wall S2 is substantially vertical with respect to the upper surface 31 of the drift layer 30, thereby preventing an excessive increase in the distance between the anode electrode 40 embedded in the outer peripheral trench 61 and the anode electrode 40 embedded in the center trench 62. This allows the channel region of the drift layer 30 to be pinched off reliably upon application of a backward voltage.

As described above, in the Schottky barrier diode 11 according to the present embodiment, through film thickness control of the insulating film 63, the outer peripheral wall S1 itself of the anode electrode 40 constitutes a curved surface having a large curvature radius, so that local concentration of an electric field is less likely to occur even when a backward voltage is applied. This makes it possible to prevent dielectric breakdown at the outer peripheral bottom portion of the outer peripheral trench 61, which is likely to occur upon application of a backward voltage. In addition, the outer peripheral trench 61 and the center trench 62 have the same shape except that the widths thereof are different, thus allowing the trenches 61 and 62 to be formed simultaneously.

Second Embodiment

Figure 4:
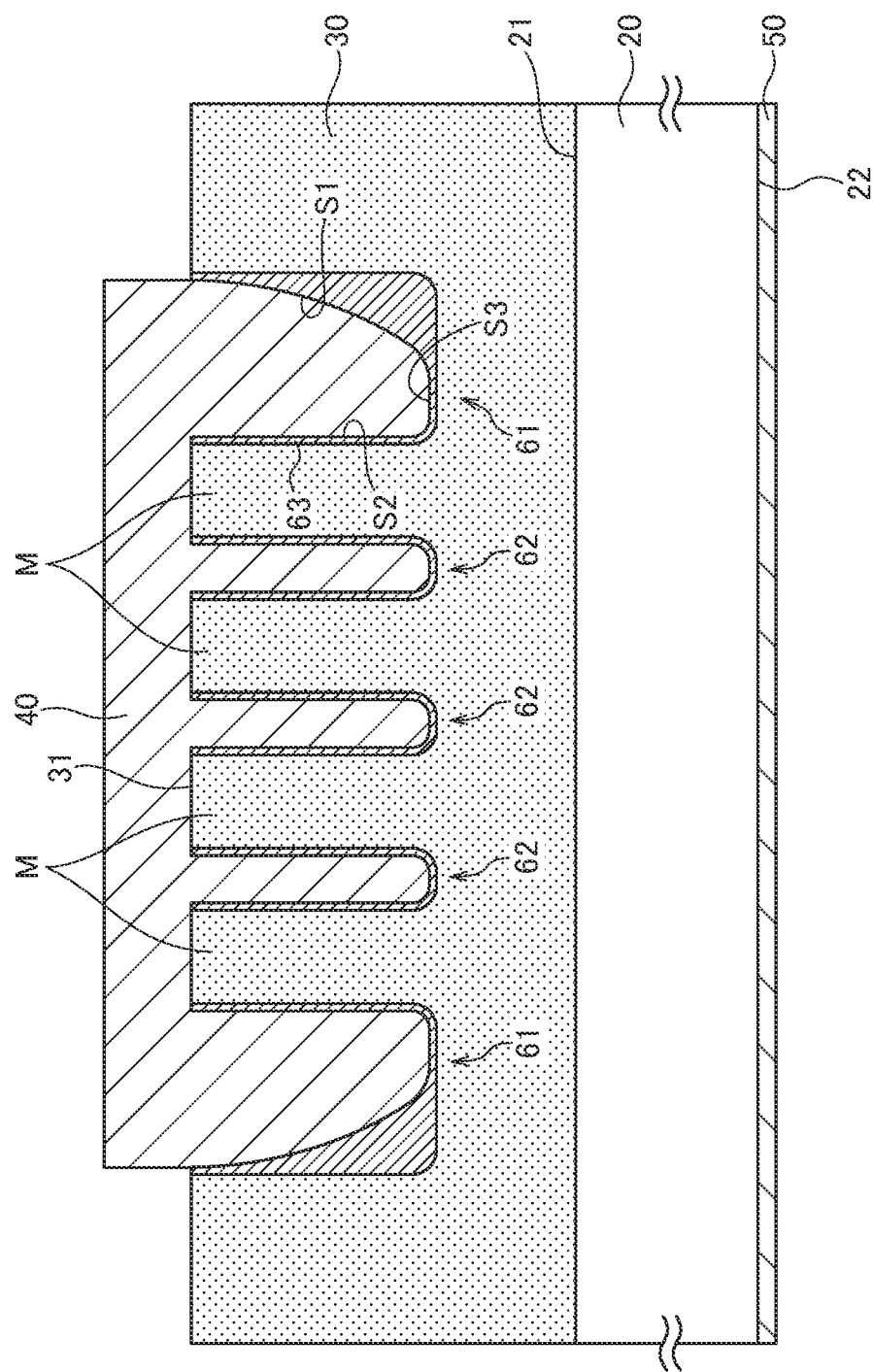
FIG. 4 is a schematic cross-sectional view illustrating the configuration of a Schottky barrier diode 12 according to a second embodiment of the present invention.

FIG. 4 is a schematic cross-sectional view illustrating the configuration of a Schottky barrier diode 12 according to a second embodiment of the present invention.

As illustrated in FIG. 4, the Schottky barrier diode 12 according to the second embodiment differs from the Schottky barrier diode 11 according to the first embodiment in that the anode electrode 40 has a substantially flat bottom surface S3. Other basic configurations are the same as those of the Schottky barrier diode 11 according to the first embodiment, so the same reference numerals are given to the same elements, and overlapping description will be omitted.

As described in the present embodiment, in the present invention, the substantially flat bottom surface S3 may exist between the outer and inner peripheral walls S1 and S2 of the anode electrode 40.

Third Embodiment

Figure 5:
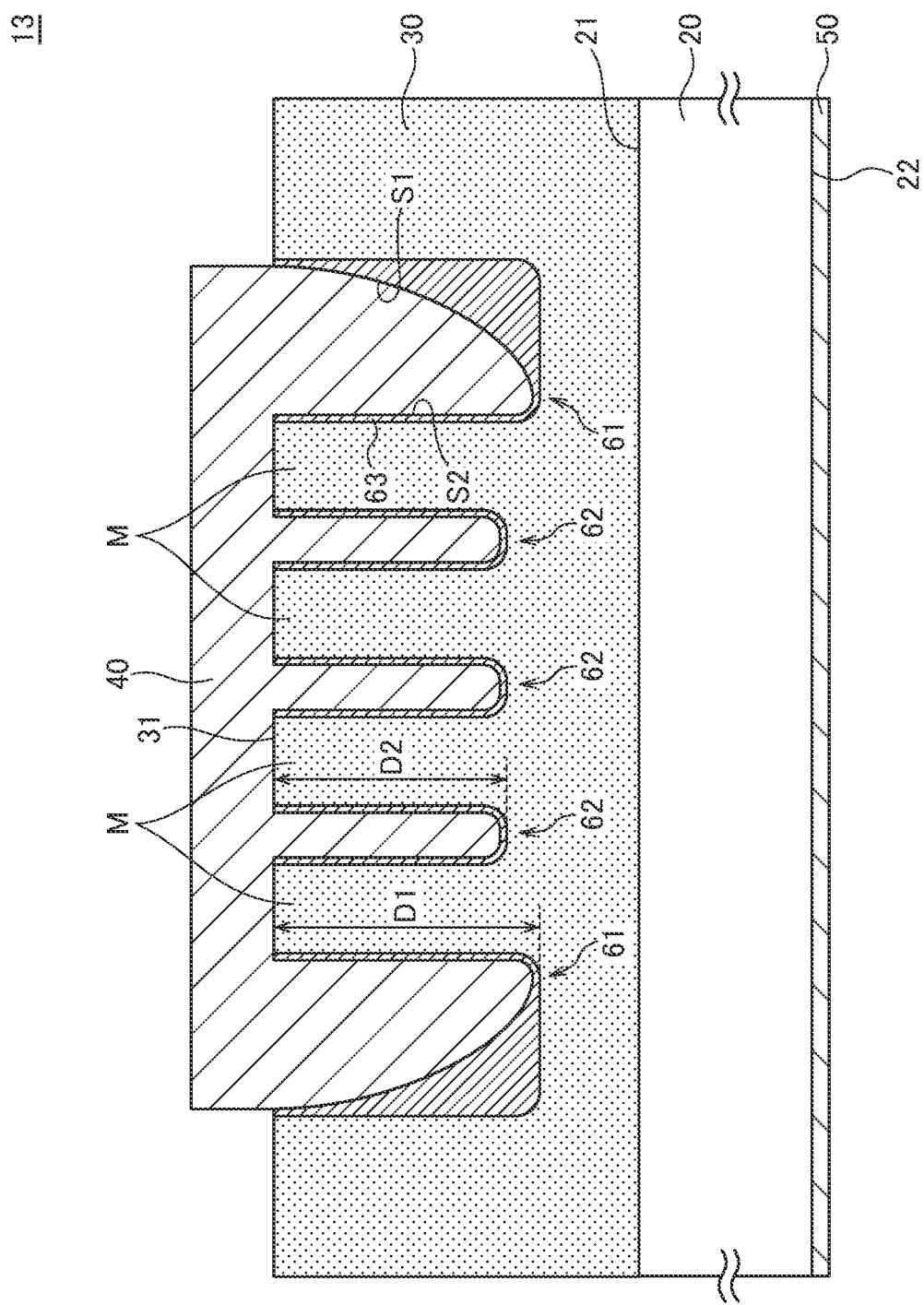
FIG. 5 is a schematic cross-sectional view illustrating the configuration of a Schottky barrier diode 13 according to a third embodiment of the present invention.

FIG. 5 is a schematic cross-sectional view illustrating the configuration of a Schottky barrier diode 13 according to a third embodiment of the present invention.

As illustrated in FIG. 5, the Schottky barrier diode 13 according to the third embodiment differs from the Schottky barrier diode 11 according to the first embodiment in that a depth D1 of the outer peripheral trench 61 is larger than a depth D2 of the center trench 62. Other basic configurations are the same as those of the Schottky barrier diode 11 according to the first embodiment, so the same reference numerals are given to the same elements, and overlapping description will be omitted.

When the depth D1 of the outer peripheral trench 61 is made larger than the depth D2 of the center trench 62 as in the present embodiment, the curvature radius of the outer peripheral wall S1 of the anode electrode 40 further increases, thus further relaxing concentration of an electric field. However, an excessively large depth D1 of the outer peripheral trench 61 excessively reduces the film thickness of the drift layer 30 positioned at the bottom of the outer peripheral trench 61, which actually strengthens an electric field. Thus, the depth D1 of the outer peripheral trench 61 is preferably set such that the thickness of the drift layer 30 positioned at the bottom of the outer peripheral trench 61 is equal to or more than 1 µm.

Fourth Embodiment

Figure 6:
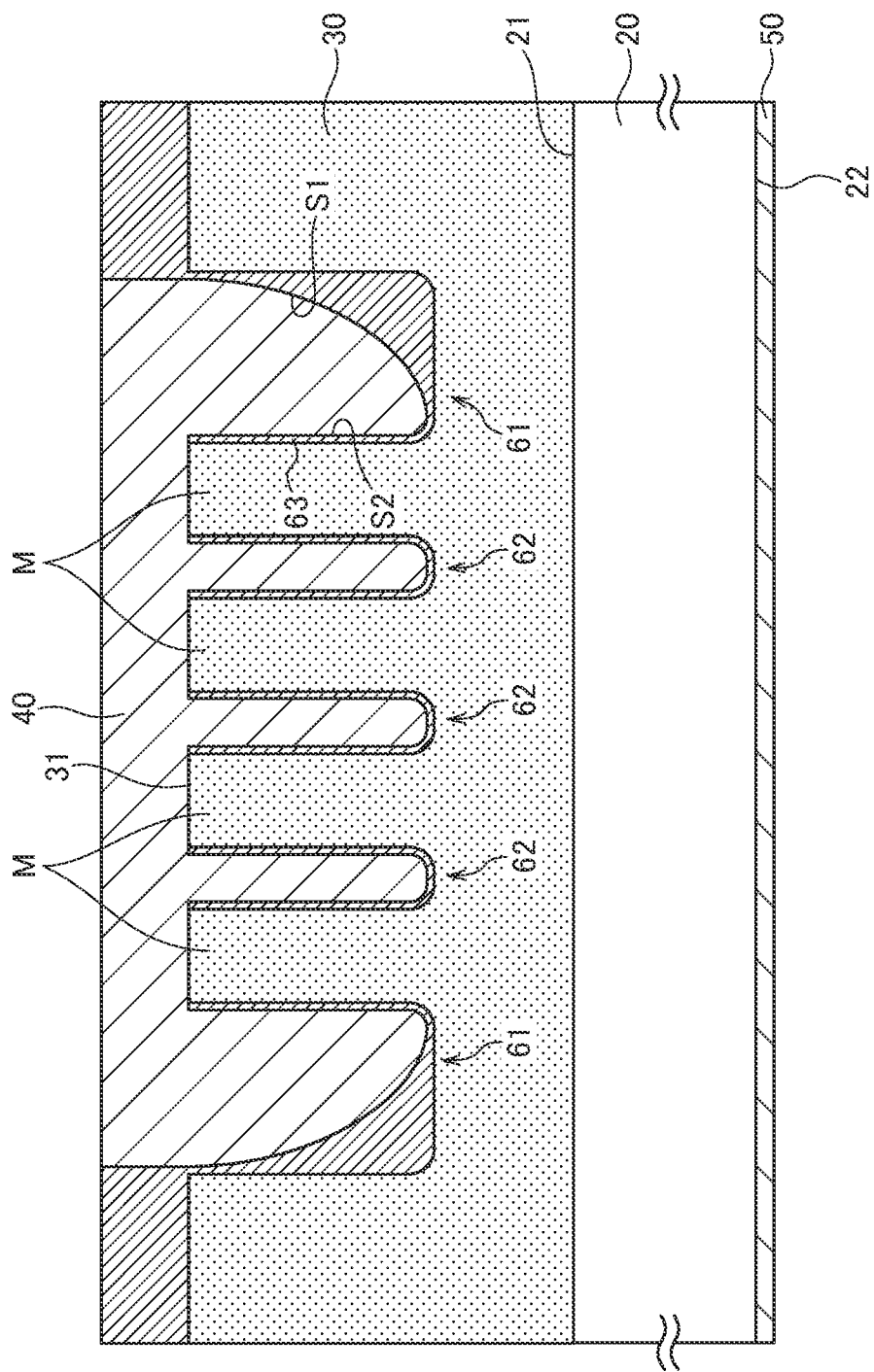
FIG. 6 is a schematic cross-sectional view illustrating the configuration of a Schottky barrier diode 14 according to a fourth embodiment of the present invention.

FIG. 6 is a schematic cross-sectional view illustrating the configuration of a Schottky barrier diode 14 according to a fourth embodiment of the present invention.

As illustrated in FIG. 6, the Schottky barrier diode 14 according to the fourth embodiment differs from the Schottky barrier diode 11 according to the first embodiment in that a part of the upper surface 31 of the drift layer 30 that is positioned outside the outer peripheral trench 61 is covered with the insulating film 63. Other basic configurations are the same as those of the Schottky barrier diode 11 according to the first embodiment, so the same reference numerals are given to the same elements, and overlapping description will be omitted.

As described in the present embodiment, when the insulating film 63 is formed not only on the inner surfaces of the trenches 61 and 62 but also on a part of the upper surface 31 of the drift layer 30 that is positioned outside the outer peripheral trench 61, the upper surface 31 of the drift layer 30 can be protected.

Figure 7:
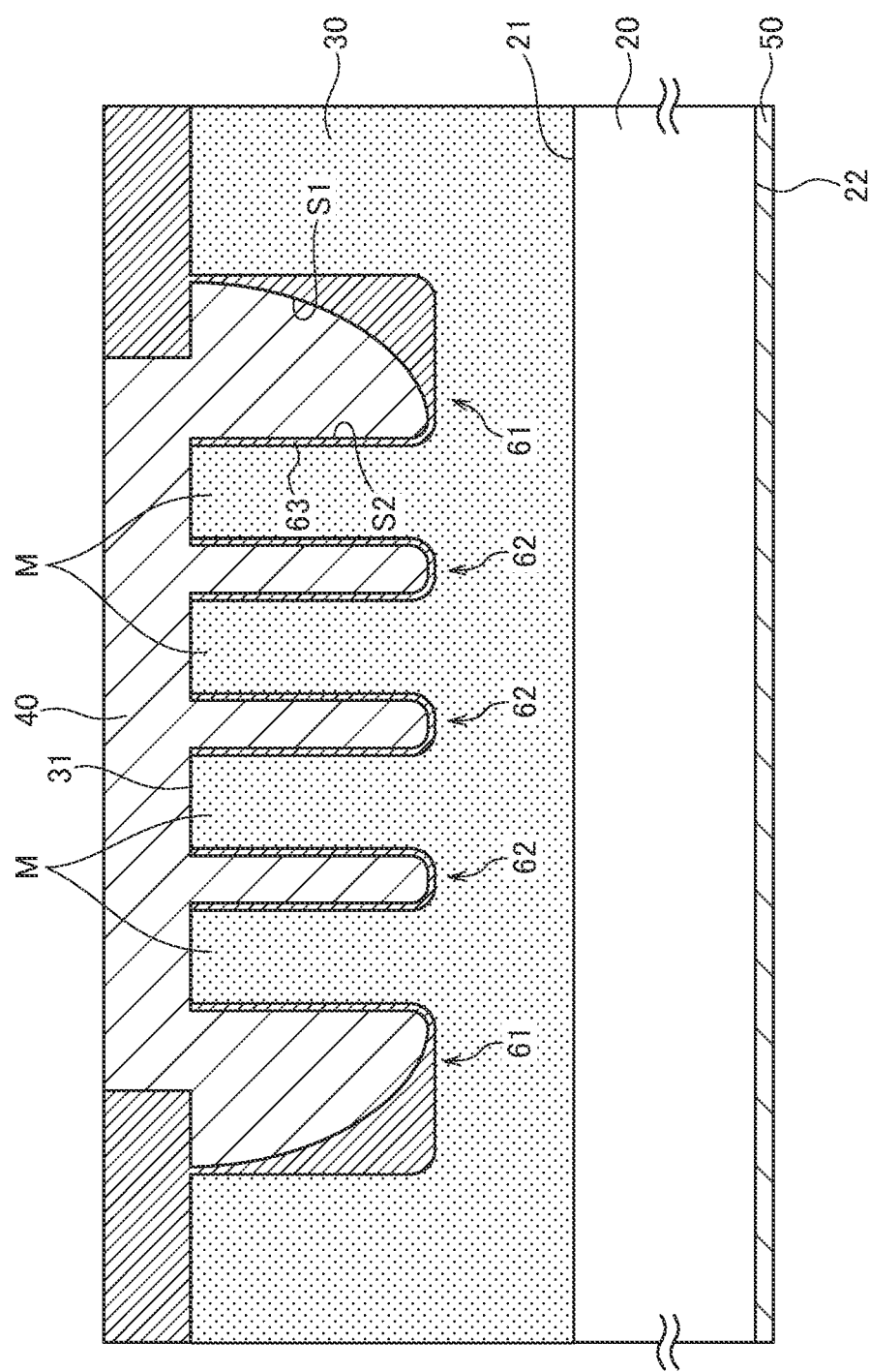
FIG. 7 is a schematic cross-sectional view illustrating the configuration of a Schottky barrier diode 14a according to a modification of the fourth embodiment.

FIG. 7 is a schematic cross-sectional view illustrating the configuration of a Schottky barrier diode 14a according to a modification of the fourth embodiment.

In the Schottky barrier diode 14a illustrated in FIG. 7, the anode electrode 40 positioned above the outer peripheral trench 61 is partly removed, and the insulating film 63 is provided at the part where the anode electrode 40 is removed. As described above, in the present invention, the upper surface of the anode electrode 40 need not be flat but may partly be removed.

Fifth Embodiment

Figure 8:
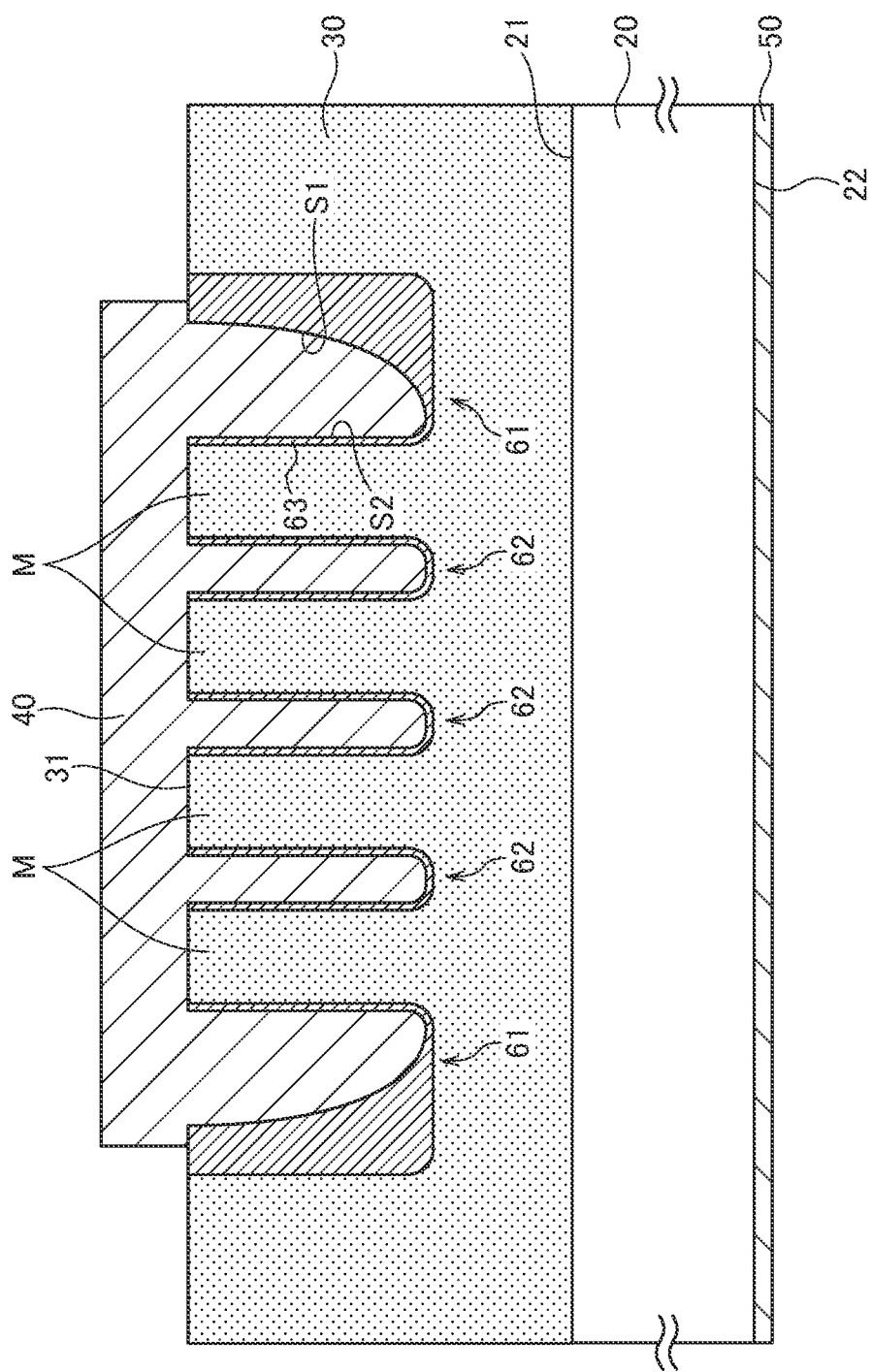
FIG. 8 is a schematic cross-sectional view illustrating the configuration of a Schottky barrier diode 15 according to a fifth embodiment of the present invention.

FIG. 8 is a schematic cross-sectional view illustrating the configuration of a Schottky barrier diode 15 according to a fifth embodiment of the present invention.

As illustrated in FIG. 8, the Schottky barrier diode 15 according to the fifth embodiment differs from the Schottky barrier diode 11 according to the first embodiment in that a part of the anode electrode 40 is formed on the insulating film 63 so as to go beyond the outer peripheral trench 61. Other basic configurations are the same as those of the Schottky barrier diode 11 according to the first embodiment, so the same reference numerals are given to the same elements, and overlapping description will be omitted.

As described in the present embodiment, in the present invention, a part of the anode electrode 40 may be formed on the insulating film 63 so as to go beyond the outer peripheral trench 61.

Fifth Embodiment

Figure 9:
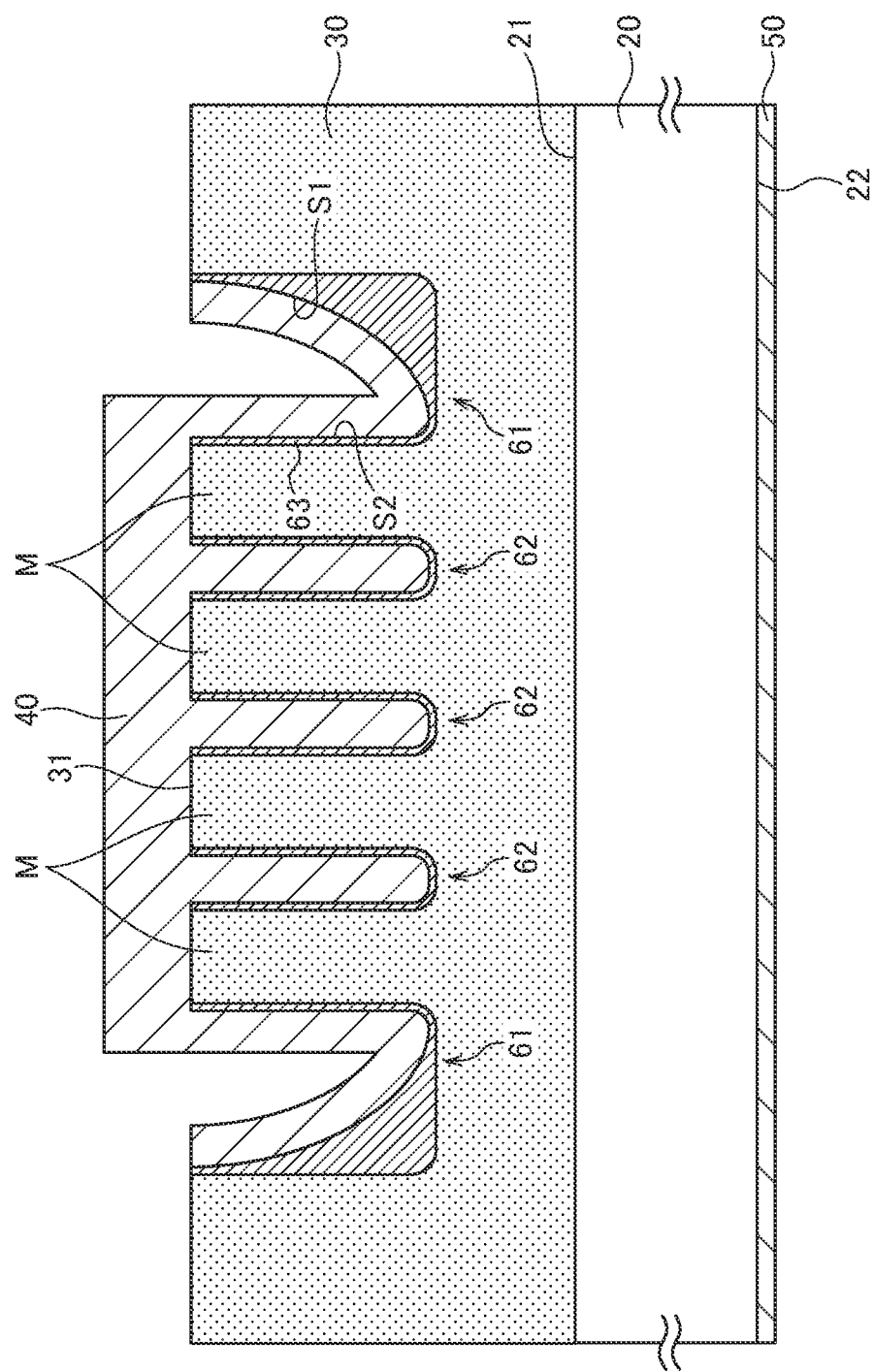
FIG. 9 is a schematic cross-sectional view illustrating the configuration of a Schottky barrier diode 16 according to a sixth embodiment of the present invention.

FIG. 9 is a schematic cross-sectional view illustrating the configuration of a Schottky barrier diode 16 according to a sixth embodiment of the present invention.

As illustrated in FIG. 9, the Schottky barrier diode 16 according to the sixth embodiment differs from the Schottky barrier diode 11 according to the first embodiment in that the anode electrode 40 that is positioned inside the outer peripheral trench 61 is partly removed. Other basic configurations are the same as those of the Schottky barrier diode 11 according to the first embodiment, so the same reference numerals are given to the same elements, and overlapping description will be omitted.

As described in the present embodiment, in the present invention, the outer peripheral trench 61 need not be filled with the anode electrode 40 but may be partially void.

Seventh Embodiment

Figure 10:
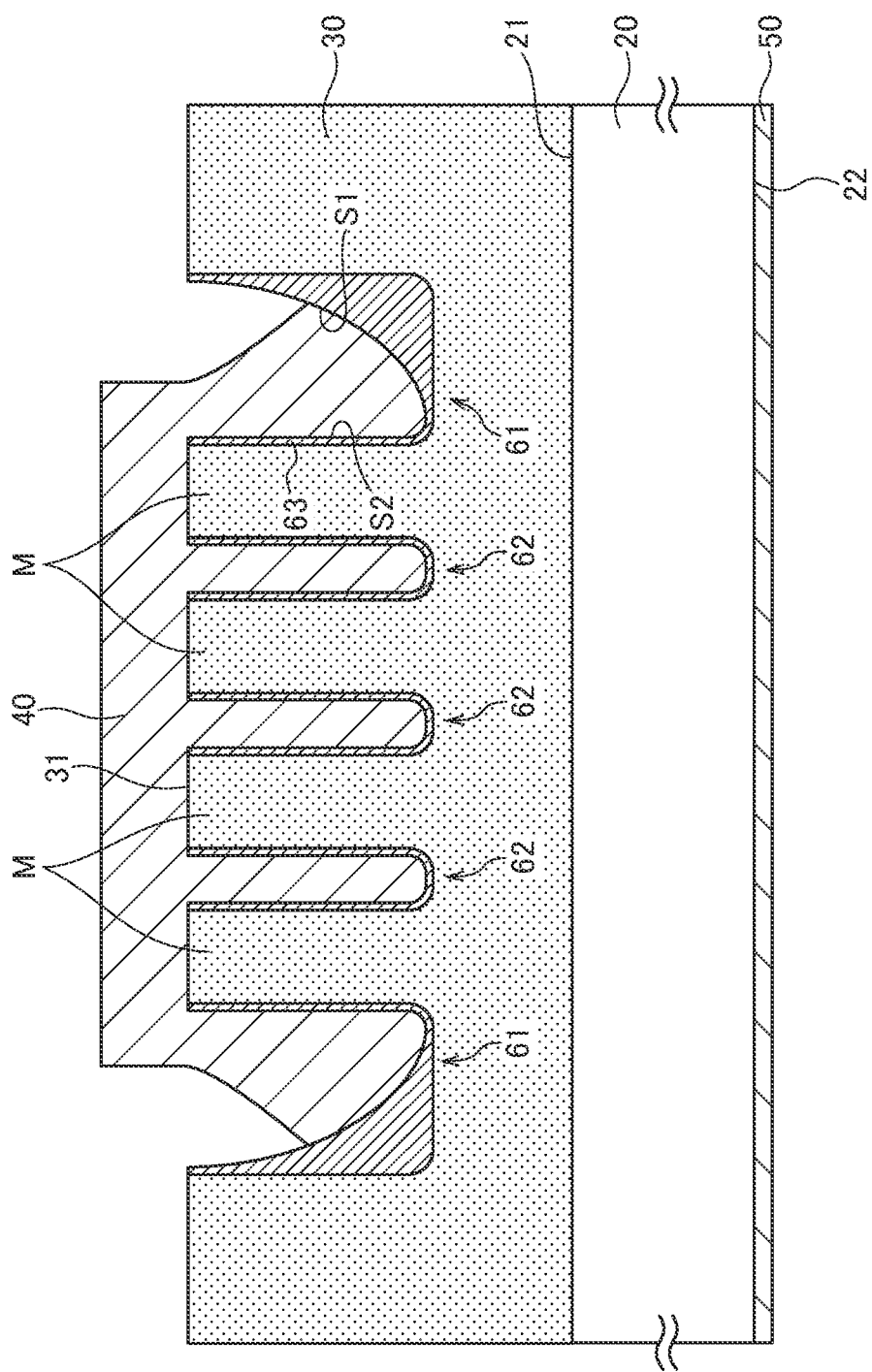
FIG. 10 is a schematic cross-sectional view illustrating the configuration of a Schottky barrier diode 17 according to a seventh embodiment of the present invention.

FIG. 10 is a schematic cross-sectional view illustrating the configuration of a Schottky barrier diode 17 according to a seventh embodiment of the present invention.

As illustrated in FIG. 10, the Schottky barrier diode 17 according to the seventh embodiment differs from the Schottky barrier diode 16 according to the sixth embodiment in that the insulating film 63 covering the outer peripheral wall of the outer peripheral trench 61 is partly exposed. Other basic configurations are the same as those of the Schottky barrier diode 16 according to the sixth embodiment, so the same reference numerals are given to the same elements, and overlapping description will be omitted.

As described in the present embodiment, in the present invention, the insulating film 63 covering the outer peripheral wall of the outer peripheral trench 61 need not completely be covered with the anode electrode 40 but may partly be exposed.

Eighth Embodiment

Figure 11:
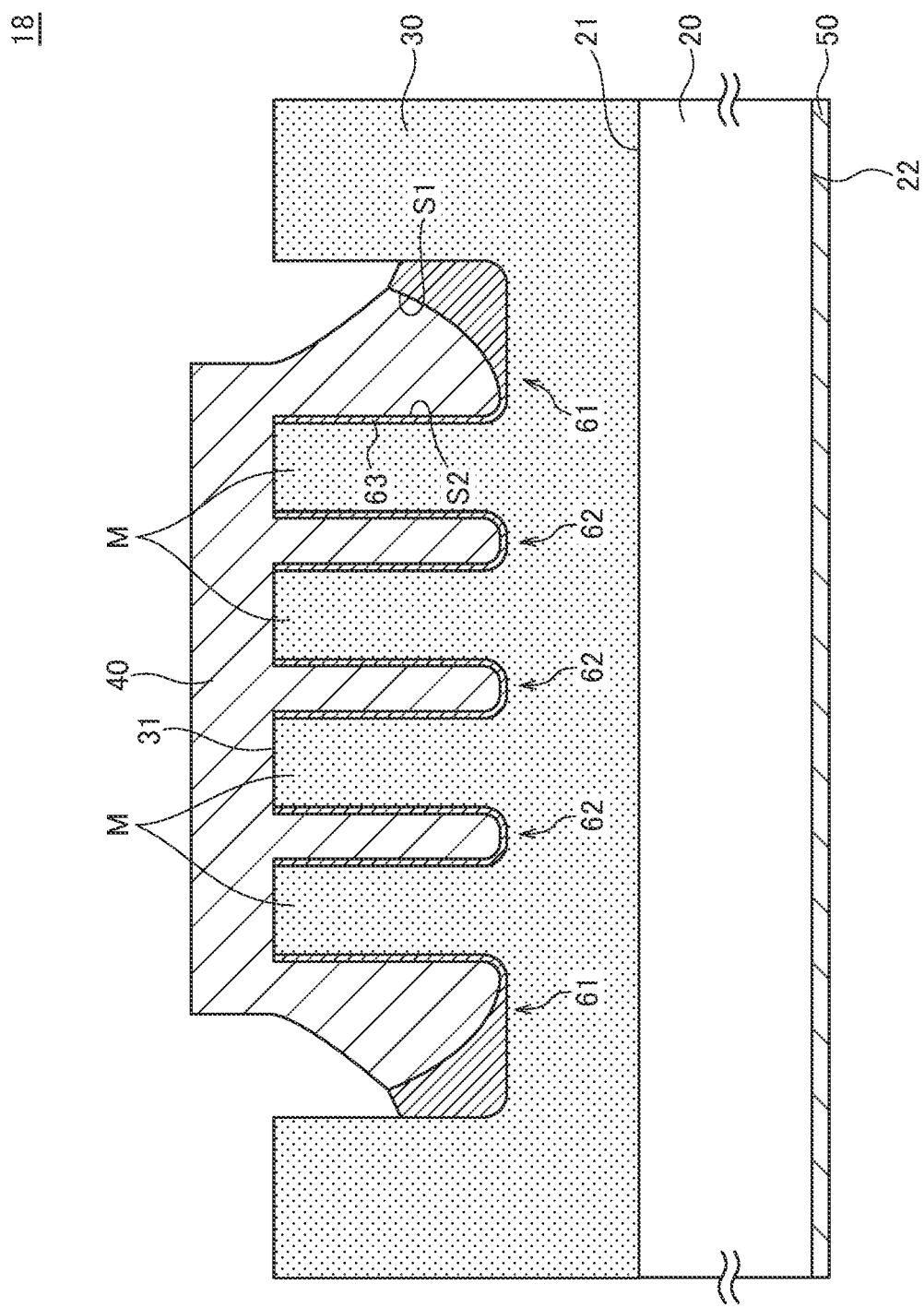
FIG. 11 is a schematic cross-sectional view illustrating the configuration of a Schottky barrier diode 18 according to an eighth embodiment of the present invention.

FIG. 11 is a schematic cross-sectional view illustrating the configuration of a Schottky barrier diode 18 according to an eighth embodiment of the present invention.

As illustrated in FIG. 11, the Schottky barrier diode 18 according to the eighth embodiment differs from the Schottky barrier diode 17 according to the seventh embodiment in that the upper portion of the outer peripheral wall of the outer peripheral trench 61 is not covered with the insulating film 63 but is exposed. Other basic configurations are the same as those of the Schottky barrier diode 17 according to the seventh embodiment, so the same reference numerals are given to the same elements, and overlapping description will be omitted.

As described in the present embodiment, in the present invention, the outer peripheral wall of the outer peripheral trench 61 need not completely be covered with the insulating film 63, but the upper portion thereof may partly be exposed.

Figure 12:
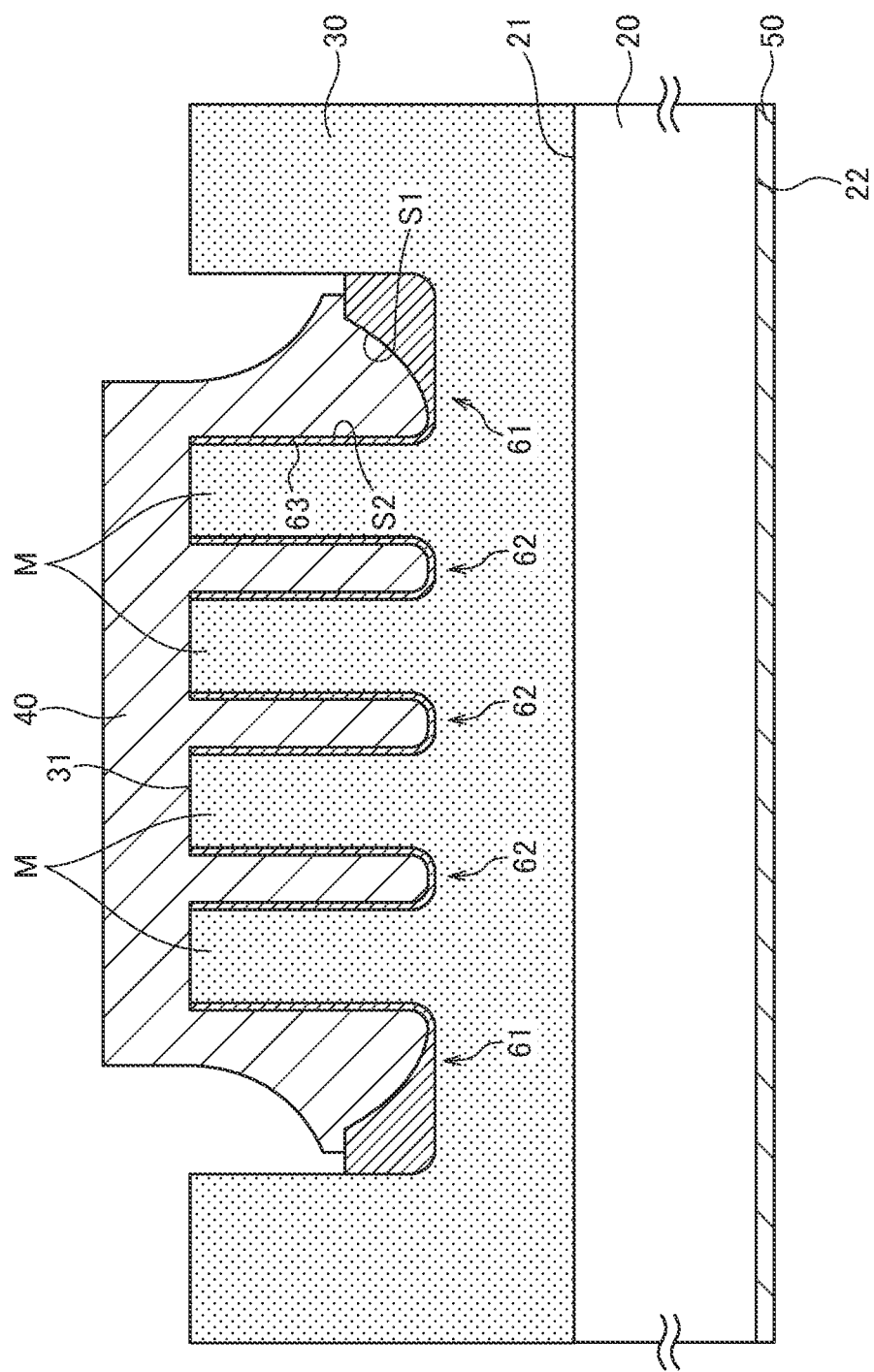
FIG. 12 is a schematic cross-sectional view illustrating the configuration of a Schottky barrier diode 18a according to a modification of the eighth embodiment.

FIG. 12 is a schematic cross-sectional view illustrating the configuration of a Schottky barrier diode 18a according to a modification of the eighth embodiment.

In the Schottky barrier diode 18a illustrated in FIG. 12, the anode electrode 40 exists on the upper surface of the insulating film 63 positioned inside the outer peripheral trench 61. Thus, a part having no insulating film 63 may exist between the anode electrode 40 and the drift layer 30 as long as they do not contact each other in the outer peripheral trench 61.

Ninth Embodiment

Figure 13:
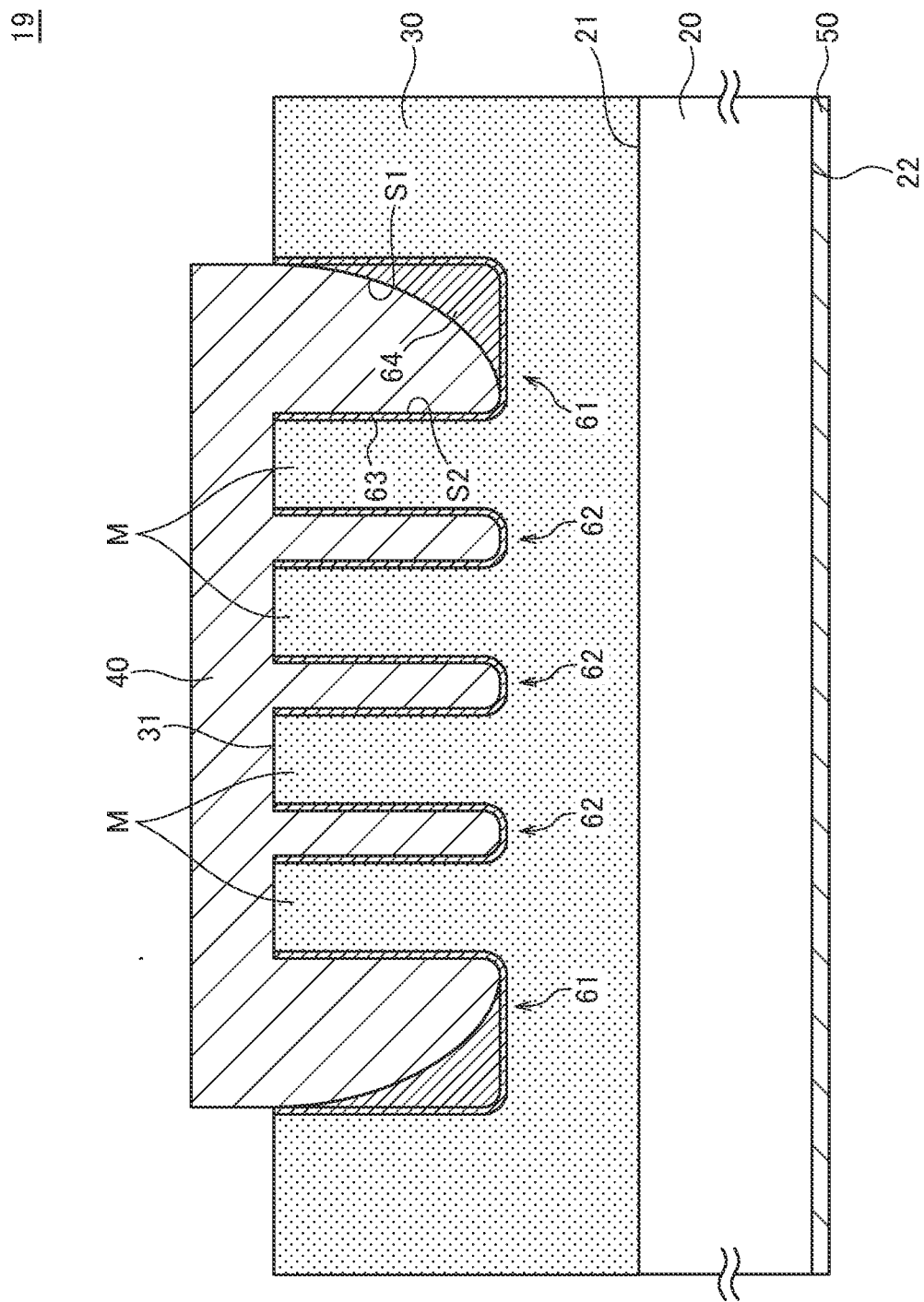
FIG. 13 is a schematic cross-sectional view illustrating the configuration of a Schottky barrier diode 19 according to a ninth embodiment of the present invention.

FIG. 13 is a schematic cross-sectional view illustrating the configuration of a Schottky barrier diode 19 according to a ninth embodiment of the present invention.

As illustrated in FIG. 13, the Schottky barrier diode 19 according to the ninth embodiment differs from the Schottky barrier diode 11 according to the first embodiment in that an insulating film 64 different from the insulating film 63 is provided inside the outer peripheral trench 61. Other basic configurations are the same as those of the Schottky barrier diode 11 according to the first embodiment, so the same reference numerals are given to the same elements, and overlapping description will be omitted.

The insulating film 64 is made of an insulating material, such as $SiO_2$, different from that of the insulating film 63 and is formed such that the thickness in the depth direction (i.e., vertical direction) thereof becomes larger toward the outside in the radial direction. On the other hand, the thickness of the insulating film 63 is substantially constant in a direction perpendicular to the inner peripheral wall of the outer peripheral trench 61.

Thus, covering the inner wall of the outer peripheral trench 61 with the insulating film having a multilayer structure facilitates control of the film thickness and characteristics of the insulating film.

While the preferred embodiment of the present disclosure has been described, the present disclosure is not limited to the above embodiment, and various modifications may be made within the scope of the present disclosure, and all such modifications are included in the present disclosure.

EXAMPLES

Example 1

A simulation model of Example 1 having the same structure as the Schottky barrier diode 19 illustrated in FIG. 13 was assumed, and electric field strength was simulated with a backward voltage of 600 V applied between the anode electrode 40 and the cathode electrode 50. The dopant concentration of the semiconductor substrate 20 was set to $1 \times 10^{18}$ $cm^{-3}$, and the dopant concentration of the drift layer 30 was to $4 \times 10^{16}$ $cm^{-3}$. The thickness of the drift layer 30 was set to 7 μm. The depths of the outer peripheral trench 61 and center trench 62 were both set to 3 μm. The width W1 of the outer peripheral trench 61 was set to 10 μm, and the width W2 of the center trench 62 and the width of the drift layer 30 at a part contacting the anode electrode 40 (i.e., width of the mesa region M) were both set to 1.5 μm. As the insulating film 63, an $HfO_2$ film having a thickness of 50 nm was used. The anode electrode 40 was made of Cu, and the cathode electrode 50 was formed of a laminated film of Ti and Au. An $SiO_2$ film was used as the insulating film 64 covering the bottom surface and outer peripheral wall of the outer peripheral trench 61, and the simulation was performed with the shape of the insulating film 64 as a variable.

Figure 14:
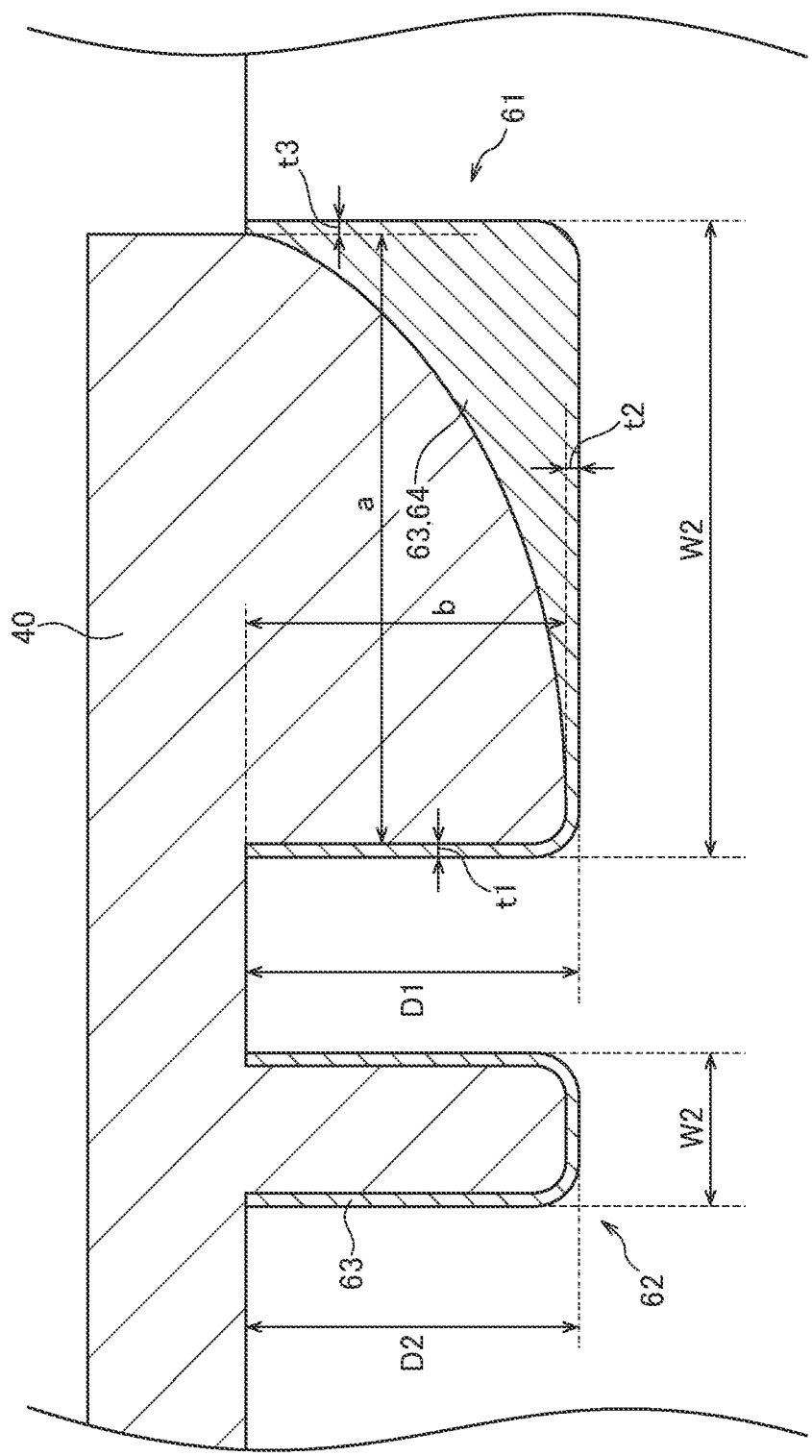
FIG. 14 is a schematic view for explaining the parameters used in Example 1.

FIG. 14 is a schematic view for explaining the parameters used in Example 1. As illustrated in FIG. 14, the radial maximum width and maximum depth of the anode electrode 40 embedded in the outer peripheral trench 61 were defined respectively as a and b. Further, the film thickness of the insulating film 63 covering the inner peripheral wall of the outer peripheral trench 61 was defined as t1, the minimum film thickness of the insulating films 63 and 64 covering the bottom surface of the outer peripheral trench 61 was defined as t2, and the minimum film thickness of the insulating films 63 and 64 covering the outer peripheral wall of the outer peripheral trench 61 was defined as t3.

In Example 1, the width a and the film thickness t3 were used as variables, while the depth b, the film thickness t1, and the film thickness t2 were fixed to 2.4 μm, 0.05 μm, and 0.6 μm, respectively.

Figure 15:
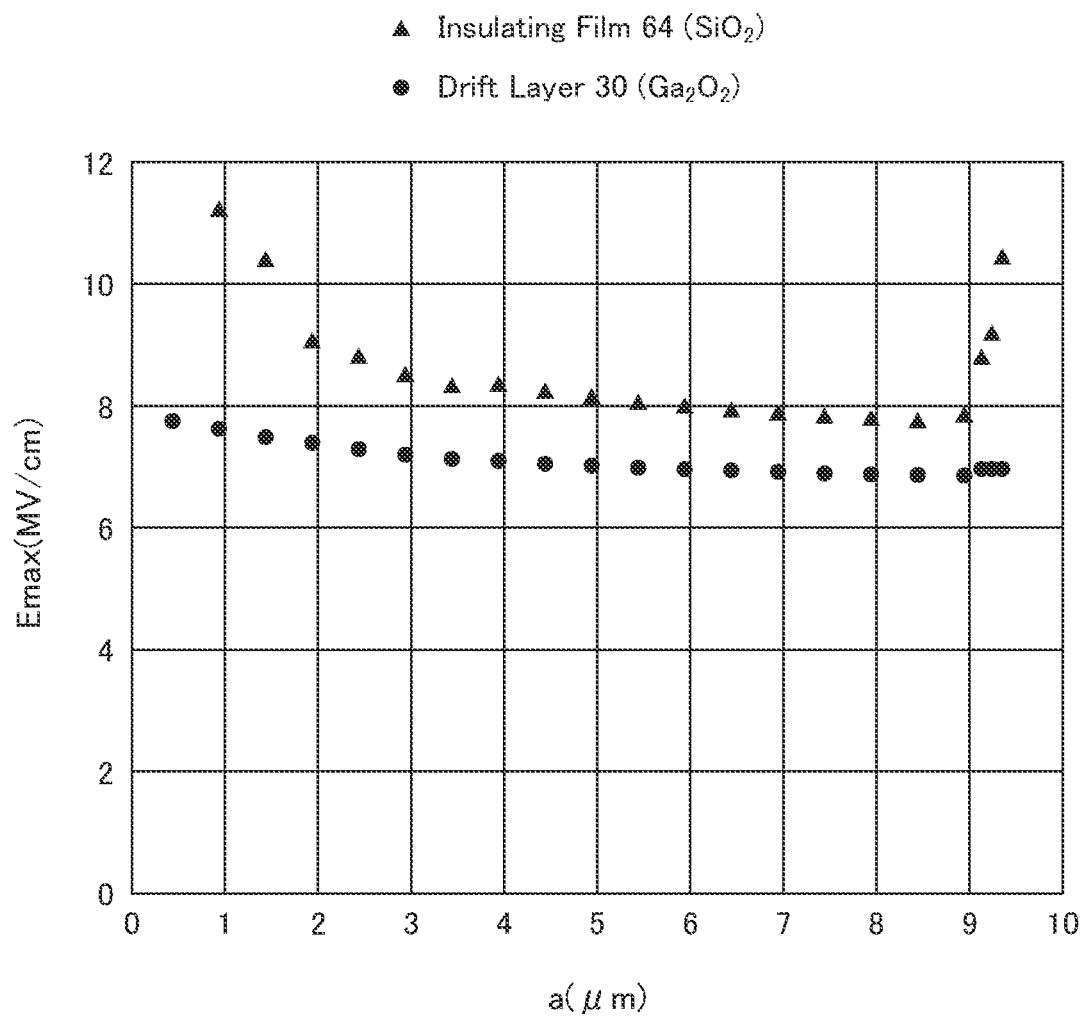
FIG. 15 is a graph illustrating the simulation results of an Example 1.

The simulation results are illustrated in FIG. 15. As illustrated in FIG. 15, when the width a of the anode electrode 40 was less than 1.5 μm (width W2 of the center trench 62, mesa width), a maximum electric field strength (Emax) applied to the insulating film 64 exceeded 10 MV/cm which was the dielectric breakdown electric field strength of silicon oxide. Further, when the width a of the anode electrode 40 exceeded 9.3 μm, the maximum electric field strength applied to the insulating film 64 exceeded 10 MV/cm which was the dielectric breakdown electric field strength of silicon oxide. On the other hand, the maximum electric field strength applied to the drift layer 30 was, regardless of the width a of the anode electrode 40, equal to or less than 8 MV/cm which is the dielectric breakdown electric field strength of the gallium oxide.

COMPARATIVE EXAMPLE

A simulation model of Comparative Example 1 having the same structure as the Schottky barrier diode 10 illustrated in FIG. 3 was assumed, and the simulation was performed under the same conditions as those for Example 1. The anode electrode 40 embedded in the outer peripheral trench 61 had a symmetrical shape, and the width a was set to 9.9 μm, the depth b was 2.95 μm, and the film thicknesses t1 to t3 were 0.05 μm. As a result, the maximum electric field strength at the outer peripheral bottom portion A illustrated in FIG. 3 was 8.6 MV/cm.

Example 2

The simulation was performed under the same conditions as those for Example 1 except that the width b and the film thickness t2 were used as variables and that the width a, the film thickness t1, and the film thickness t3 were fixed to 4.95 μm, 0.05 μm, and 5 μm, respectively.

Figure 16:
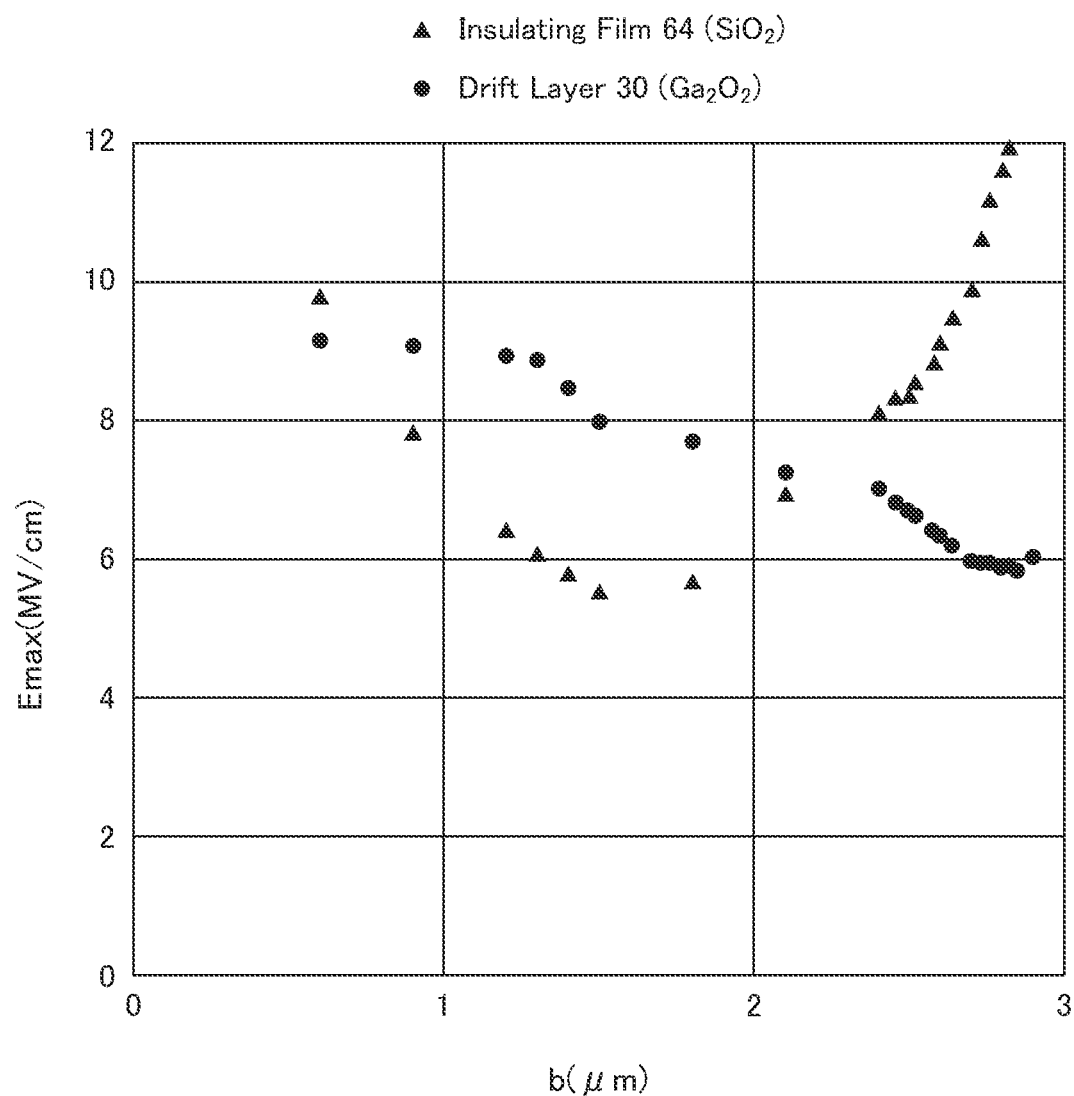
FIG. 16 is a graph illustrating the simulation results of an Example 2.

The simulation results are illustrated in FIG. 16. As illustrated in FIG. 16, when the film thickness t2 was less than 1/10 (0.3 μm) of the depth D1 of the outer peripheral trench 61, the maximum electric field strength applied to the insulating film 64 exceeded 10 MV/cm which was the dielectric breakdown electric field strength of silicon oxide. Further, when the depth b of the anode electrode 40 was less than 1.5 μm, the maximum electric field strength applied to the drift layer 30 exceeded 8 MV/cm which was the dielectric breakdown electric field strength of gallium oxide.

Example 3

The simulation was performed under the same conditions as those for Example 2 except that the depth D1 of the outer peripheral trench 61 was set to 4 μm, 5 μm, and 6 μm.

The simulation results are illustrated in FIG. 17. As shown in FIG. 17, when the film thickness t2 was less than 1/10 of the depth D1 of the outer peripheral trench 61, the maximum electric field strength applied to the insulating film 64 exceeded 10 MV/cm which was the dielectric breakdown electric field strength of silicon oxide. Further, the electric field strength applied to the drift layer 30 was relaxed more as the depth D1 of the outer peripheral trench 61 increased.

REFERENCE SIGNS LIST 10-19, 14a, 18a Schottky barrier diode
20 semiconductor substrate
21 upper surface of semiconductor substrate
22 back surface of semiconductor substrate
30 drift layer
31 upper surface of the drift layer
40 anode electrode
50 cathode electrode 61 outer peripheral trench
62 center trench
63, 64 insulating film
A outer peripheral bottom portion
B inner peripheral bottom portion
M mesa region
S1 outer peripheral wall
S2 inner peripheral wall
S3 bottom surface

What is claimed is:

1. A Schottky barrier diode comprising:
a semiconductor substrate made of gallium oxide;
a drift layer made of gallium oxide and provided on the semiconductor substrate;
an anode electrode brought into Schottky contact with the drift layer;
a cathode electrode brought into ohmic contact with the semiconductor substrate; and
an insulating film covering an inner wall of a trench formed in the drift layer,
wherein the trench includes a ring-shaped outer peripheral trench and a center trench formed in an area surrounded by the outer peripheral trench,
wherein a part of the anode electrode is embedded in the outer and center trenches through the insulating film, and
wherein the insulating film is formed such that a thickness thereof in a depth direction of the outer peripheral trench becomes larger toward an outside, whereby an outer peripheral wall of the anode electrode embedded in the outer peripheral trench is curved so as to approach vertical toward the outside.

2. The Schottky barrier diode as claimed in claim 1, wherein an inner peripheral wall of the anode electrode embedded in the outer peripheral trench is closer to vertical than the outer peripheral wall.

3. The Schottky barrier diode as claimed in claim 1, wherein the outer peripheral trench is larger in width than the center trench.

4. The Schottky barrier diode as claimed in claim 1, wherein the outer peripheral trench is larger in depth than the center trench.

5. The Schottky barrier diode as claimed in claim 1, wherein an upper surface of the drift layer positioned outside the outer peripheral trench is covered with the insulating film.

6. The Schottky barrier diode as claimed in claim 1, wherein a part of the insulating film that covers at least the inner wall of the outer peripheral trench has a multilayer structure.

7. The Schottky barrier diode as claimed in claim 2, wherein the outer peripheral trench is larger in width than the center trench.

* * * * *